(12) United States Patent
Jeon et al.

(10) Patent No.: US 9,190,576 B2
(45) Date of Patent: Nov. 17, 2015

(54) LIGHT EMITTING DEVICE HAVING PHOTONIC CRYSTAL STRUCTURE

(75) Inventors: Heon Su Jeon, Gunpo-si (KR); Kook Heon Char, Seoul (KR); Yoon Kyung Choi, Seoul (KR); Ho Sub Kim, Seoul (KR); Kyungtaek Min, Seoul (KR)

(73) Assignee: SNU R&DB FOUNDATION, Seoul (KR)

( * ) Notice: Subject to any disclaimer, the term of this patent is extended or adjusted under 35 U.S.C. 154(b) by 30 days.

(21) Appl. No.: 12/955,139

(22) Filed: Nov. 29, 2010

(65) Prior Publication Data

US 2011/0068676 A1     Mar. 24, 2011

Related U.S. Application Data

(63) Continuation-in-part of application No. PCT/KR2009/002830, filed on May 28, 2009.

(30) Foreign Application Priority Data

May 28, 2008  (KR) .................. 10-2008-0049414
May 27, 2009  (KR) .................. 10-2009-0046577

(51) Int. Cl.
  *H01J 1/62*    (2006.01)
  *H01L 33/50*   (2010.01)

(52) U.S. Cl.
  CPC ......... *H01L 33/50* (2013.01); *H01L 2933/0083* (2013.01)

(58) Field of Classification Search
  CPC .................. H01L 2933/0083; H01L 33/50
  See application file for complete search history.

(56) References Cited

U.S. PATENT DOCUMENTS

| | | | |
|---|---|---|---|
| 2004/0170352 A1* | 9/2004 | Summers et al. | 385/16 |
| 2004/0252509 A1* | 12/2004 | Lin | 362/293 |
| 2006/0192225 A1* | 8/2006 | Chua et al. | 257/100 |
| 2007/0024175 A1* | 2/2007 | Chua et al. | 313/486 |
| 2007/0237479 A1* | 10/2007 | Seol et al. | 385/129 |
| 2008/0007156 A1* | 1/2008 | Gibson et al. | 313/503 |
| 2008/0029710 A1 | 2/2008 | Sekiya et al. | |
| 2008/0061304 A1* | 3/2008 | Huang et al. | 257/79 |

* cited by examiner

*Primary Examiner* — Nimeshkumar Patel
*Assistant Examiner* — Jacob R Stern
(74) *Attorney, Agent, or Firm* — Paratus Law Group, PLLC

(57) ABSTRACT

A light emitting device comprising a photonic crystal structure having a crystal structure in which nanospheres are densely arranged in a 3D manner, wherein the nanospheres have phosphors excited by an excitation source to emit light of a wavelength longer than a pump photon of the excitation source, wherein the photonic crystal structure has at least a photonic bandgap (PBG) along a specific crystal orientation, and wherein the wavelength of the pump photon overlaps a photonic bandedge region.

11 Claims, 16 Drawing Sheets

FIG. 3
(a)
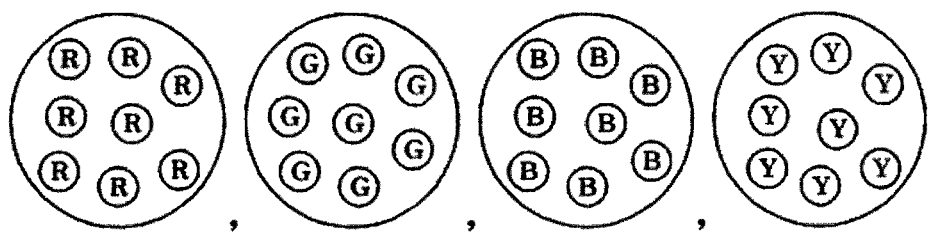
(b)
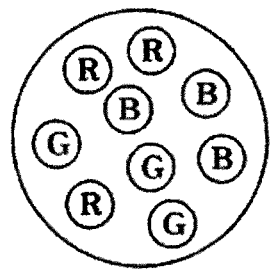

FIG. 9
(a) Sedimentation
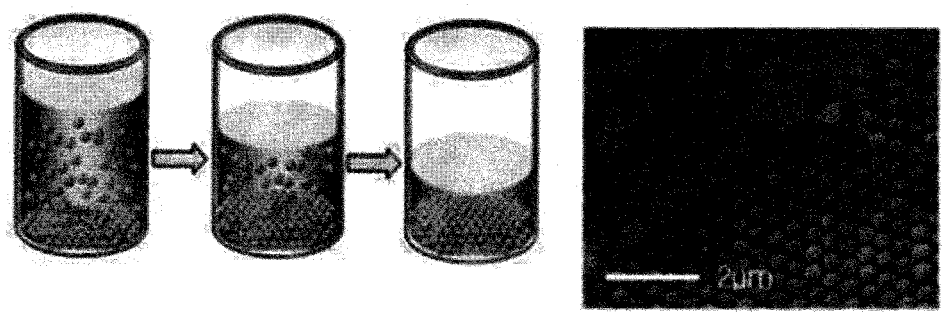
(b) Vertical dip coating
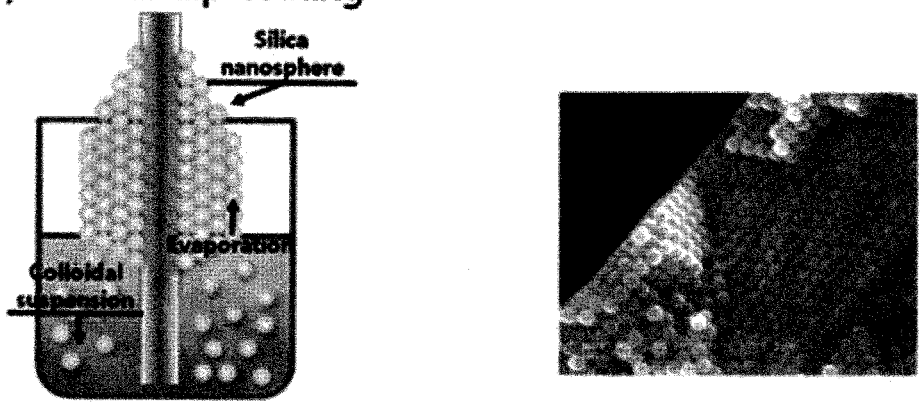

FIG. 10
 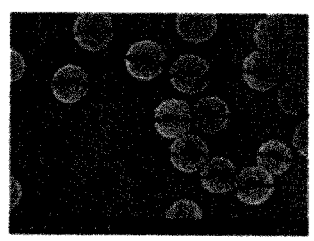 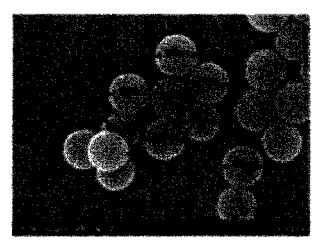
Size ~160nm  Size ~180nm  Size ~220nm

LIGHT EMITTING DEVICE HAVING PHOTONIC CRYSTAL STRUCTURE

CROSS REFERENCE TO PRIOR APPLICATIONS

This application is a Continuation-In-Part Application of PCT International Patent Application No. PCT/KR2009/002830 (filed on May 28, 2009) designating the United States, which claims priority to Korean Patent Application Nos. 10-2008-0049414 (filed on May 28, 2008) and 10-2009-0046577 (filed on May 27, 2009), which are all hereby incorporated by reference in their entirety.

TECHNICAL FIELD

The described technology relates generally to a light emitting device having a photonic crystal structure, and more particularly, to a light emitting device having a photonic crystal structure containing phosphors, thereby improving luminous efficiency.

BACKGROUND

A light emitting diode (LED), which is a type of semiconductor light source, is a compound semiconductor having a p-n junction structure. The LED refers to a device that emits light by recombination of minority carriers (electrons or holes). The LED is increasingly used for various lighting applications, as well as parts of information processing and communication apparatuses because it has low power consumption and long life span. And the LED may be installed in a limited space, and has strong endurance against vibration. Also, the LED has been manufactured in various types of light emitting devices which are suitable for applications. In particular, in addition to the device emitting light of a single wavelength such as a blue, green or red wavelength, white light emitting devices have been launched in recent years. As the white light emitting devices are applied to products for automobiles and general lighting products, their demands are expected to suddenly increase. There are three representative methods of obtaining white light using the LED.

First, there is a method of obtaining a white color by a combination of three LEDs generating the three primary colors of light such as red, green and blue, of light. In this method, luminous efficiency is improved, but exact control of operating drivers is required to obtain a white color with certainty. Also, products may be increased in size, optical properties and reliability of the products may be affected due to different temperature properties of the three LEDs.

Second, there is a method which uses a blue LED as a light source. In this method, yellow phosphors are excited, and blue light which is not absorbed by the phosphors is combined with yellow light to obtain a white color. In this case, since the yellow phosphors should be excited in the vicinity of 450 nm, there is a limit to the kinds of the phosphors, and color rendition is not good.

Third, there is a method of exciting the three primary color phosphors to obtain a white color using an ultraviolet (UV) LED as a light source. Since this method is used to obtain white light using three wavelengths which are converted by the UV rays, it is excellent in theory in that the type of phosphors are diverse and high color rendition is expected. In practice, however, the method has problems regarding low conversion efficiency of the phosphors, degradation of a sealing material by the UV rays, or eye safety in case of UV leakage.

SUMMARY

In one embodiment, there is provided a light emitting device comprising an excitation source; and a photonic crystal structure arranged on the excitation source and having phosphors excited by light emitted from the excitation source to emit light.

In another embodiment, there is provided a light emitting device including a photonic crystal structure having a crystal structure in which nanospheres are densely arranged in a 3D manner. The nanospheres contain phosphors excited by an excitation source to emit light of a wavelength longer than a pump photon of the excitation source. Here, the photonic crystal structure has at least a photonic bandgap along a specific crystal orientation, and the wavelength of the pump photon overlaps a photonic bandedge region of the photonic crystal structure.

In still another embodiment, there is provided a method of manufacturing a light emitting device including providing an excitation source; providing a dispersion of nanospheres having phosphors; and stacking a photonic crystal structure by applying the dispersion onto the excitation source. Here, a wavelength of a pump photon of the excitation source overlaps a photonic bandedge region of the photonic crystal structure.

The Summary is provided to introduce a selection of concepts in a simplified form that are further described below in the Detailed Description. The Summary is not intended to identify key features or essential features of the claimed subject matter, nor is it intended to be used as an aid in determining the scope of the claimed subject matter.

BRIEF DESCRIPTION OF THE DRAWINGS

The above and other features and advantages of the present disclosure will become more apparent to those of ordinary skill in the art by describing in detail example embodiments thereof with reference to the attached drawings in which:

FIG. 3 is a diagram illustrating various examples of nanospheres containing phosphors.

FIG. 9 shows diagrams schematically illustrating methods of stacking a photonic crystal structure using self-assembly and scanning electron microscope (SEM) photographs of the photonic crystal structures formed by the methods.

FIG. 10 is a SEM photograph illustrating changes in size of silica nanospheres prepared in Preparation Examples 2, 3 and 5.

DETAILED DESCRIPTION

It will be readily understood that the components of the present disclosure, as generally described and illustrated in the Figures herein, could be arranged and designed in a wide variety of different configurations. Thus, the following more detailed description of the embodiments of apparatus and methods in accordance with the present disclosure, as represented in the Figures, is not intended to limit the scope of the disclosure, as claimed, but is merely representative of certain examples of embodiments in accordance with the disclosure.

It will also be understood that when an element or layer is referred to as being "on" another element or layer, the element or layer may be directly on the other element or layer or intervening elements or layers may be present.

Figure 1:
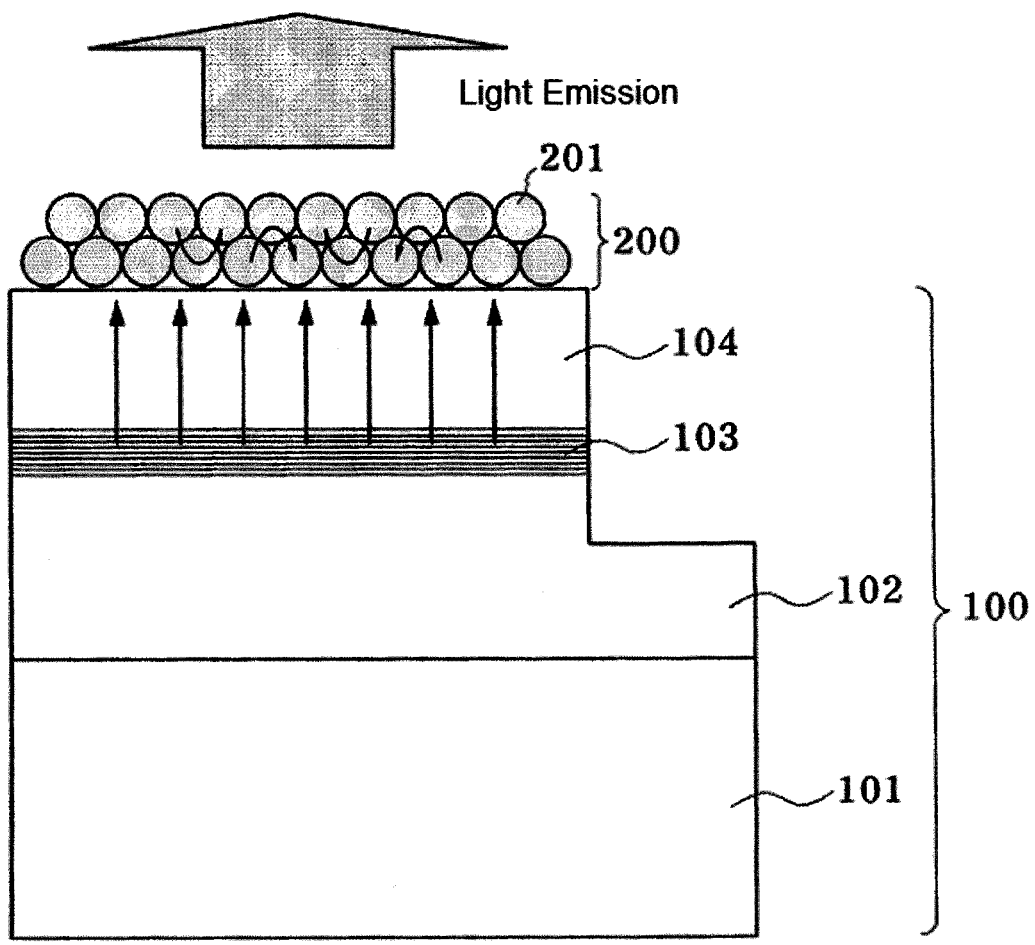
FIG. 1 is a cross-sectional view illustrating a light emitting device having a photonic crystal structure according to one embodiment.

FIG. 1 is a cross-sectional view illustrating a light emitting device having a photonic crystal structure according to one embodiment. Referring to FIG. 1, the light emitting device may include an excitation source 100 and a photonic crystal structure 200 arranged on the excitation source 100 and composed of nanospheres 201 containing phosphors.

The excitation source 100 may excite the phosphors to emit light which is shifted to a wavelength longer than an emission wavelength of the excitation source 100. The excitation source 100 may be a light emitting diode (LED) or a laser diode (LD). For example, the excitation source 100 may be a LED that emits light at a range between 360 and 480 nm. More particularly, the excitation source 100 may be a blue LED that emits light of a wavelength of around 460 nm, a violet LED that emits light of a wavelength of around 405 nm, or a UV LED that emits light of a wavelength less than the wavelength of the violet LED.

The excitation source 100 may have a structure in which a substrate 101, an n-type doped semiconductor layer 102, an active layer 103 and a p-type doped semiconductor layer 104 are sequentially stacked. As the substrate 101, sapphire, silicon, gallium nitride, gallium arsenide, silicon carbide, zinc oxide, glass, etc. may be used. The n-type doped semiconductor layer 102 and the p-type doped semiconductor layer 104 may be AlInGaN-based III-V Group nitride semiconductor layers, for example, n-GaN- and p-GaN-based semiconductor layers, respectively. Silicon, germanium, selenium, tellurium, carbon, etc. may be used as an n-type dopant, and magnesium, zinc, beryllium, calcium, strontium, barium, etc. may be used as a p-type dopant. The active layer 103 may have a single- or multi-quantum well structure composed of an AlInGaN-based semiconductor material, and may include a binary system such as aluminum nitride, gallium nitride and indium nitride, a ternary system such as gallium nitride-indium and gallium nitride-aluminum, and a quaternary system.

In general, the excitation source 100 may emit light in the following manners. Electrons go beyond a lower potential barrier from the n-type doped semiconductor layer 102 grown on the substrate 101, and are injected into a region of a depletion layer of the p-type doped semiconductor layer 104, and holes are injected in an opposite direction. The injected electrons and holes are continuously recombined in the active layer 103, and energy emitted during the recombination procedure escapes from the excitation source 100 in the form of a photon.

The photonic crystal structure 200 may be arranged on the excitation source 100. The term "photonic crystal" refers to a periodic optical nanostructure that is designed to affect the behavior of photons in a similar way that periodicity of a semiconductor crystal affects the motion of electrons. The photonic crystal is generally characterized in that different materials having a period of several hundred nanometers to several micrometers are arranged in a 1D, 2D or 3D manner. When light with a certain wavelength region collides with the photonic crystal structure, some of the light penetrates the photonic crystal structure while the rest is reflected. In this case, a wavelength region of the light reflected without penetrating the photonic crystal is referred to as a photonic bandgap (PBG). Also, a region corresponding to a boundary interface between a transmission wavelength region and the PBG is referred to as a photonic bandedge.

When a wavelength of light incident to the photonic crystal structure corresponds to a region of the photonic bandedge, light passing through the photonic crystal structure forms a mode of standing waves. A photonic bandedge effect in which photons are redistributed inside the structure may be seen in the mode.

The photonic crystal structure 200 may be, for example, formed by colloidal self-assembly. In the self-assembly process, monodispersed colloidal particles which are dispersed in a medium may be slowly crystallized by precipitation or evaporation. The colloidal crystal may have a hexagonal close-packed (hcp) structure or a face-centered cubic (fcc) structure, both of which are uniformly formed of several nanometer-sized colloidal particles, and the fcc structure is known to be more stable in a thermodynamic aspect. Such a colloidal crystal, i.e., opal structure, does not have a PBG with respect to all crystal orientations, but may have a partial bandgap, i.e., a pseudo-bandgap, in a specific crystal orientation.

Figure 2:
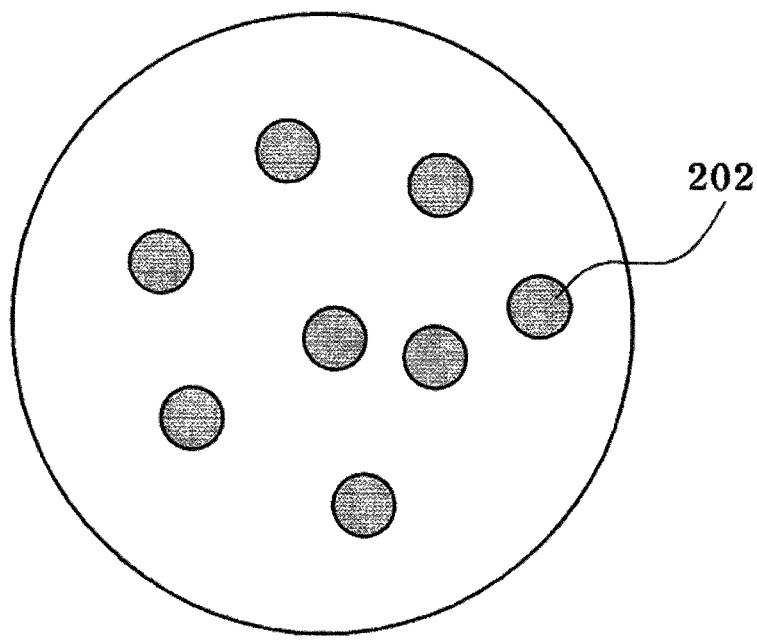
FIG. 2 is a cross-sectional view of a nanosphere forming the photonic crystal structure according to one embodiment.

The photonic crystal structure 200 may have a 3D array structure in which the nanospheres 201 containing phosphors are stacked in multiple layers. FIG. 2 is a cross-sectional view of a nanosphere forming the photonic crystal structure according to one embodiment. Referring to FIG. 2, the nanosphere 201 may have phosphors 202 distributed in a matrix thereof. Also, unlike in the drawing, the phosphors 202 may be arranged on surfaces of the nanospheres 201.

As shown in FIGS. 1 and 2, as the phosphors 202 are inserted into the nanospheres 201, the phosphors 202 may be excited by energy emitted by the excitation source 100 to emit a certain color. For example, when the light emitting device is used for lighting, it may emit white light.

The photonic crystal structure 200 may have a crystal structure in which the nanospheres 201 are densely arranged in a 3D manner. The nanospheres 201 may contain the phosphors 202 which are excited by the excitation source 100 to emit light of a wavelength longer than a pump photon of the excitation source 100. The crystal structure may be an hcp structure or an fcc structure. The nanospheres 201 may have diameters of several ten to several hundred nanometers (nm). Also, the crystal structure may have at least a PBG with respect to the specific crystal orientation, and a wavelength of the pump photon may overlap the photonic bandedge region.

The pump photon emitted from the excitation source 100 excites the phosphors 202 in the photonic crystal structure 200 on the excitation source 100. In this case, the pump photon may be effectively redistributed inside the photonic crystal structure 200 by the above-mentioned photonic band-edge effect. Finally, the redistributed pump photon may effectively excite the phosphors 202 to maximize excitation efficiency. Also, when the pump photon of the excitation source 100 has a wavelength of a UV region, the phosphors 202 is effectively excited by the photonic bandedge effect as described, and simultaneously the emission of UV rays, which are harmful to the human body, may be prevented from leaking out of the light emitting device.

Organic or inorganic particles may be used as the nanospheres 201. For example, polystyrene (PS), poly(methylmethacrylate) (PMMA) or silica particles may be used as the nanospheres 201. The phosphors 202 may be at least one selected from the group consisting of red, green, yellow and blue phosphors. The colors of phosphors emitting a wavelength of a visible region are not limited to the above-mentioned colors. The phosphors may include organic phosphors, inorganic phosphors, nanophosphors, quantum dot phosphors, etc.

In order to use the light emitting device for lighting applications, it is preferred that white light is extracted from the light emitting device. For example, when the blue LED is used as the excitation source 100 to manufacture a white light emitting device, the phosphors 202 such as YAG emitting a yellow light may be used. Also, when the UV LED is used as the excitation source 100, the phosphors 202 having mixed red, green and blue colors are excited to emit white light. In addition to the white color, various combinations of the phosphors 202 may be excited by the excitation source 100 to generate a certain color.

FIG. 3 is a diagram illustrating various examples of nanospheres containing phosphors. Referring to FIG. 3, each of the nanospheres may independently contain a red (R), green (G), yellow (Y), or blue (B) phosphor as shown in (a) of FIG. 3, and each of the nanospheres may contain mixed R, G and B phosphors as shown in (b) of FIG. 3. For example, the nanospheres, each of which contains all the R, G and B phosphors may be used for the white light emitting device, or the nanospheres containing each R, G or B phosphor may be manufactured, and mixed to generate a white color. Also, when the nanospheres are manufactured using the above-mentioned method by selecting the respective phosphors in a suitable ratio, various colors can be emitted in addition to the white color.

The photonic crystal structure may have a PBG of a specific wavelength region, as described above. In order to determine energy of a region corresponding to the PBG, periodicity of the photonic crystal, radii of nanosphere particles, and an emission wavelength region of the LED may be important factors. The important factors will be described in detail with reference to FIG. 4.

Figure 4:
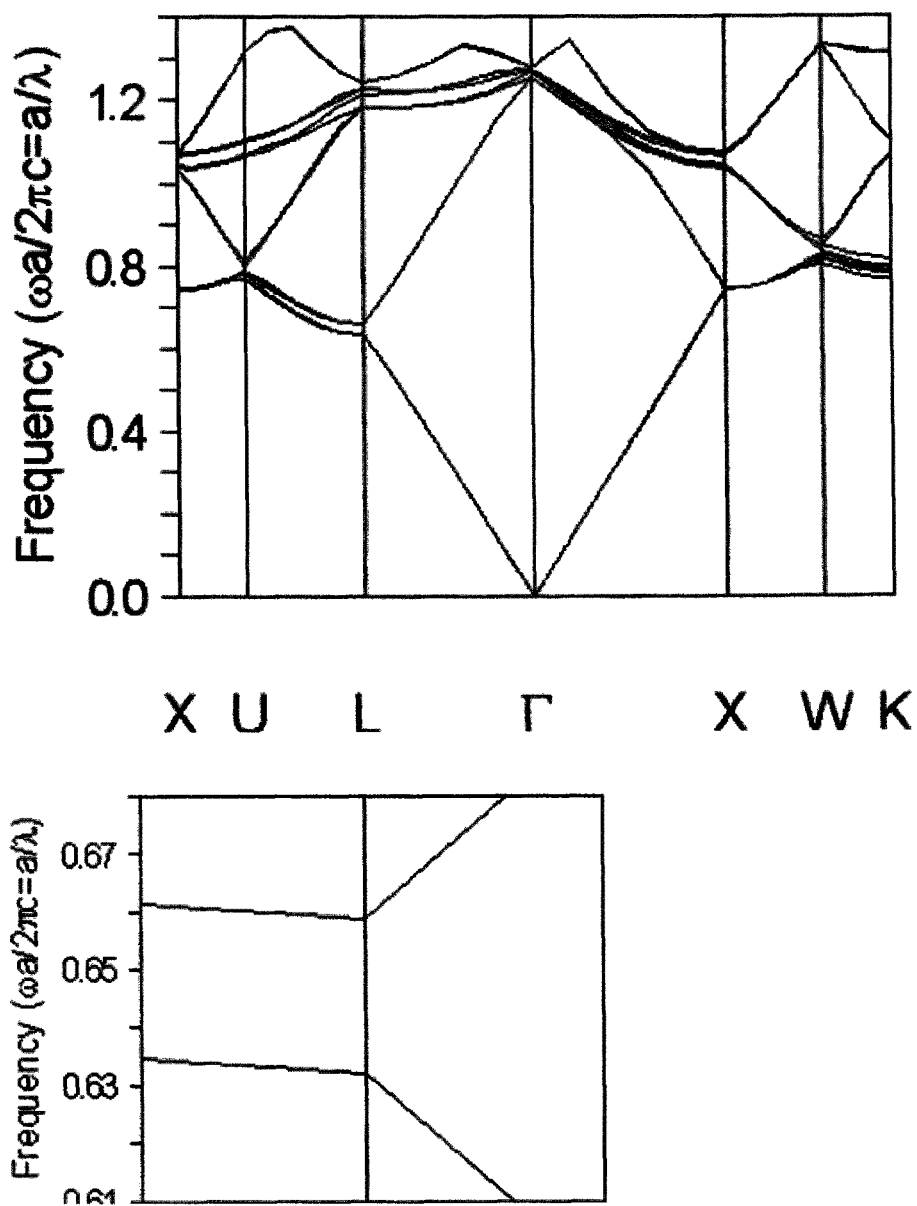
FIG. 4 shows a photonic band structure of a photonic crystal composed of silica ($SiO_2$) particles in the air, which have a face-centered cubic (fcc) structure.

FIG. 4 shows a photonic band structure of a photonic crystal composed of silica ($SiO_2$) particles in the air, which have an fcc structure. Referring to FIG. 4, the X axis represents a wave vector, and the Y axis represents non-dimensional energy $a/\lambda$ (a: lattice constant, $\lambda$: wavelength of light). It was revealed that the silica particles may have a pseudo-bandgap at an L point, that is, along a [111] direction. Light corresponding to the energy included in the PBG is not transmitted due to periodic arrangement of the photonic crystal, and reflected by the photonic crystal. This means that a band structure is formed inside the photonic crystal due to repetition of coherent multiple scattering of light, and thus light of a specific wavelength may not be present inside the photonic crystal. More particularly, in the case of a silica opal, for example, a PBG region corresponds to a region where $a/\lambda$ is higher than 0.632 and lower than 0.659, as shown in FIG. 4. Meanwhile, the photonic bandedge refers to a photonic band region that is present below and above the PBG. In the case of the silica opal structure shown in FIG. 4, a region where $a/\lambda$ is lower than 0.632 and a region where $a/\lambda$ is higher than 0.659 represents the photonic bandedges. A preferred condition is that a wavelength of the phosphor excitation source overlaps one of the two above-mentioned photonic bandedge regions, and more preferably, overlaps a lower portion of the photonic bandedge region.

The size of the nanospheres may be adjusted so that the wavelength of the excitation source can correspond to the photonic bandedge of the photonic crystal. For example, when a violet LED having an emission wavelength of approximately 405 nm is used as the excitation source, a lattice constant of a corresponding fcc structure satisfies $a=0.632\times405$ nm$=256$ nm, and diameters of the silica particles approximately satisfy $\phi=a/\sqrt{2}=180$ nm.

According to one embodiment, in addition to the above-mentioned 3D structure, the photonic crystal structure may be a 1D distributed Bragg reflector (DBR) structure containing phosphors. This has a 1D photonic crystal structure having a PBG since it has a structure in which materials having different indices of refraction are alternately stacked in layers. In this case, the thicknesses of the layers comprising the DBR may be adjusted so that a wavelength of the pump photon emitted from the excitation source can correspond to a photonic bandedge region of the photonic crystal structure.

In general, the photonic crystal structure according to one embodiment has an opal structure formed by arrangement of silica, but may have an inverse opal structure. For the inverse opal structure, spheres forming the structure are filled with air, and dielectrics having different indices of refraction surround the remaining spaces. The inverse opal structure may be manufactured by a process such as colloidal templating. For example, the photonic crystal structure having the inverse opal structure containing phosphors may be formed, as described above, by forming a silica opal structure, infiltrating a monomer such as methyl methacrylate containing phosphors into voids, and removing silica particles using hydrofluoric acid (HF).

Figure 5:
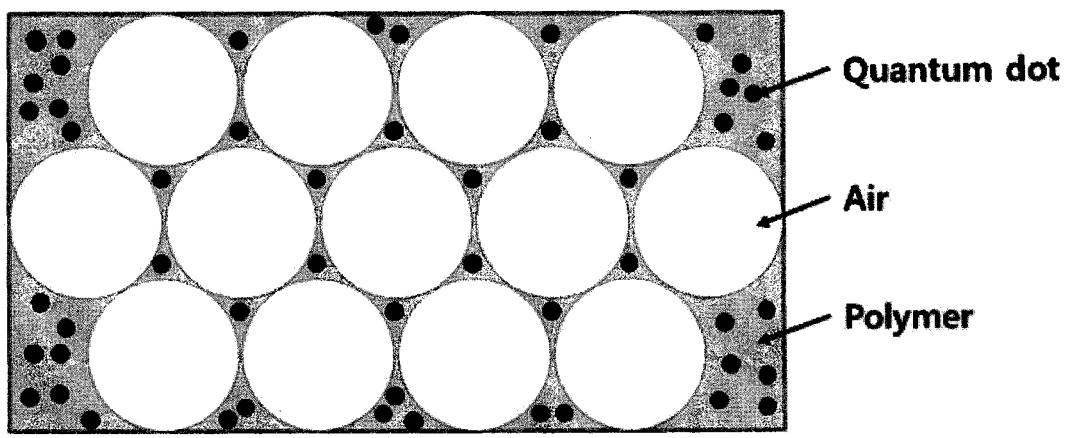
FIG. 5 is a diagram illustrating one embodiment of a photonic crystal structure having an inverse opal structure.
Figure 6:
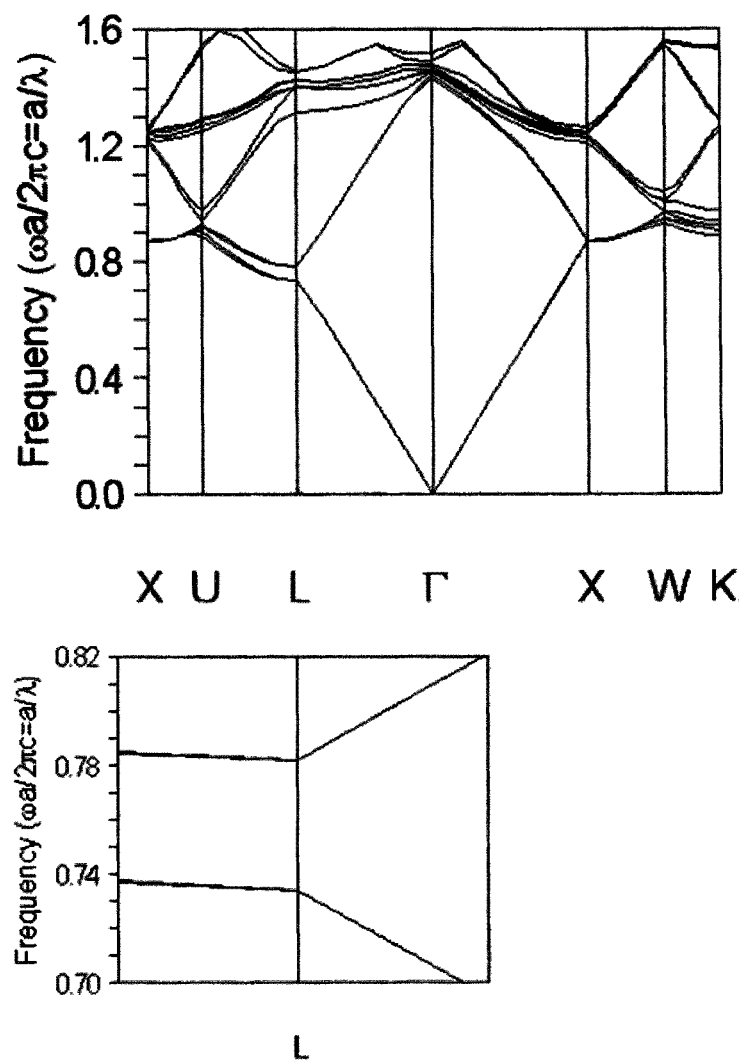
FIG. 6 shows a photonic band structure of the photonic crystal structure having an inverse opal structure illustrated in FIG. 5.

FIG. 5 is a diagram illustrating one embodiment of the photonic crystal structure having an inverse opal structure, and FIG. 6 is a diagram illustrating a photonic band structure of the photonic crystal structure. Here, a PBG region corresponds to a region in which $a/\lambda$ is higher than 0.734 and lower than 0.782. Therefore, the photonic bandedge means a region in which $a/\lambda$ is lower than 0.734 and a region in which $a/\lambda$ is higher than 0.782. When a wavelength of the pump photon is 405 nm, the spheres of the inverse opal structure have a diameter of approximately 210 nm so that the wavelength can overlap a lower portion of the photonic bandedge.

As described above, when the size of the nanospheres is adjusted so that the wavelength of the pump photon emitted from the excitation source can correspond to the photonic bandedge region of the photonic crystal, the pump photon may enhance photonic conversion efficiency by exciting the phosphors for a long period of time.

Figure 7:
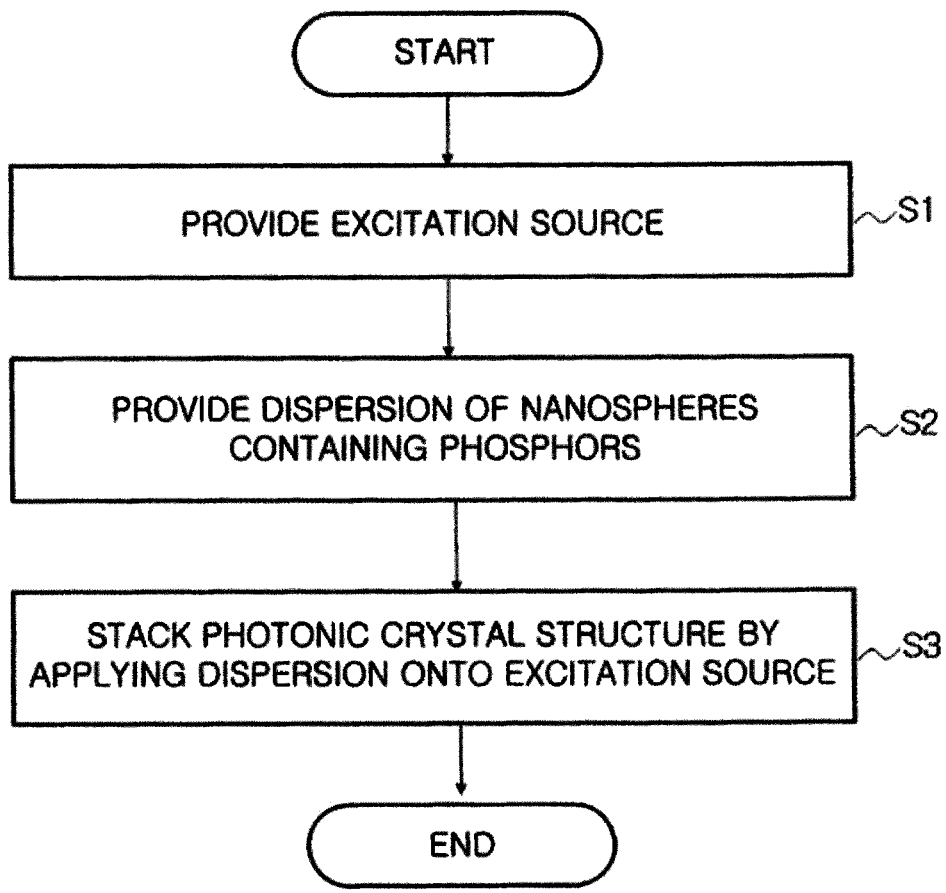
FIG. 7 is a process flowchart illustrating a method of manufacturing a light emitting device.

FIG. 7 is a process flowchart illustrating a method of manufacturing a light emitting device. Referring to FIG. 7, an excitation source is provided in step S1. The excitation source may be an LED having an emission wavelength below a blue region. For example, the excitation source may be an LED emitting light at a range between 360 and 480 nm. More particularly, the excitation source may become a blue LED emitting light of a wavelength of around 460 nm, a violet LED emitting light of a wavelength of around 405 nm, or a UV LED emitting light of a wavelength of less than 405 nm.

In step S2, a dispersion of nanospheres containing phosphors is provided. According to one embodiment, the nanospheres containing phosphors, for example, silica nanospheres containing phosphors may be synthesized in a uniform size using Stober method. The dispersion of silica nanospheres may be prepared by reacting a mixture including alcohol, ammonium hydroxide, a silica precursor and the phosphors together. Alternatively, the dispersion of silica nanospheres may be prepared by a sequential reaction including introducing a silica precursor into a mixture of alcohol and ammonium hydroxide and adding the phosphors after a predetermined time, for example, 1 to 10 minutes, after the introduction of the silica precursor. In the case of the latter preparation method, since final particles grow on uniform silica cores of a uniform size generated after the introduction of the silica precursor, their shapes may be nearly spherical, and their size distribution may be uniform. The size of the silica nanospheres may depend on an amount of each reactant, the kind of alcohol and the temperature condition.

As described above, the phosphors may be at least one selected from the group consisting of blue, green, yellow, and red phosphors to be excited by the excitation source to emit light of a visible region. Examples of the phosphors used may include Ir-based phosphors in the form of Ir(L)$_2$Cl-APTES. Here, the 'L' may be a ligand such as dfppy, piq and ppy as represented by the following Formula 1, and the phosphors have a structure where the aminopropyltriethoxysilane (APTES) coordinates with the surroundings of Ir. Therefore, the phosphors may be readily introduced into the silica particles.

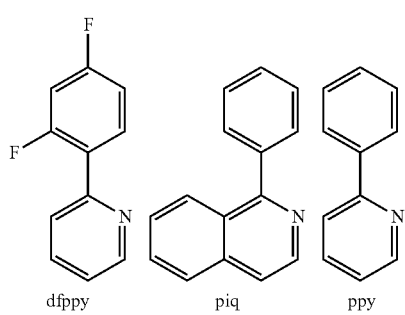

<Formula 1> dfppy     piq     ppy

Figure 8:
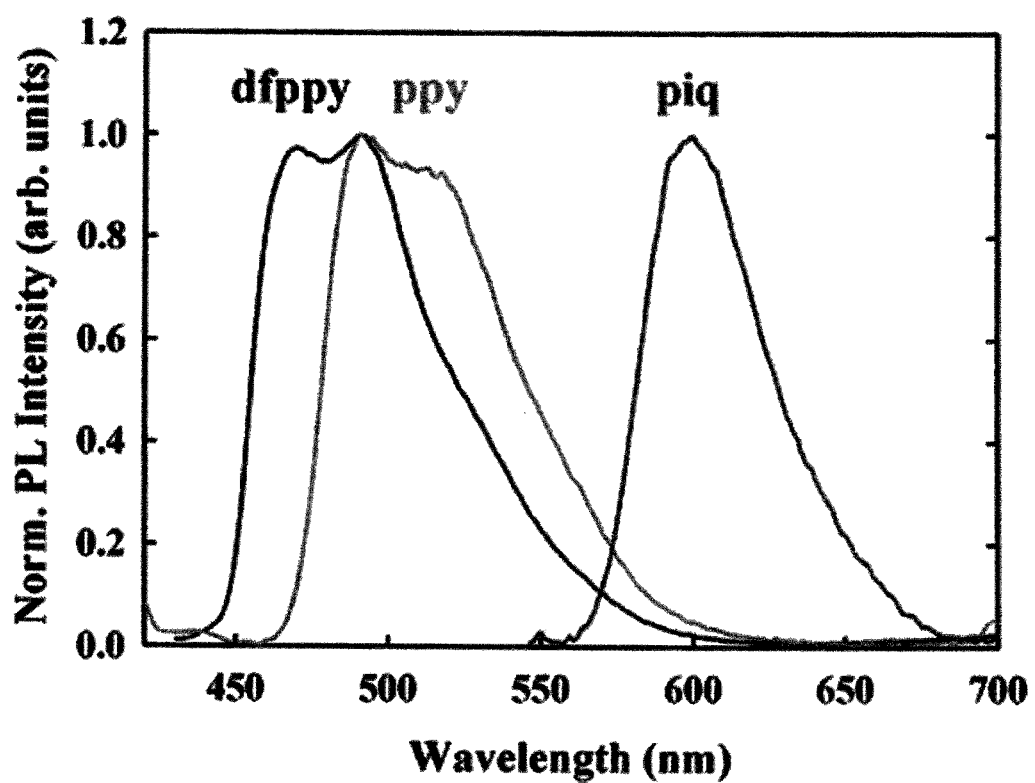
FIG. 8 is a graph illustrating emission spectra of various kinds of phosphors.

FIG. 8 is a graph illustrating emission spectra of various kinds of phosphors. Referring to FIG. 8, when the L represents dfppy, piq and ppy, the phosphors may emit light of blue, red and greenish yellow regions, respectively.

According to one embodiment, when a GaN-base LED is used as the excitation source to manufacture a white light emitting device, an Ir-based phosphor (Ir(ppy)$_2$-APTES) represented by Formula 2 may be used, which may be excited by a wavelength of around 405 nm to emit light of a greenish yellow region. In this case, a near white color may be obtained by a combination of a violet light emitted from the excitation source and a greenish yellow light from the Ir-based phosphor.

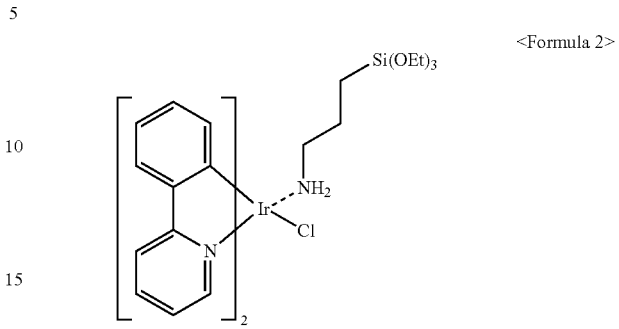

<Formula 2>

Referring again to FIG. 7, in step S3, a photonic crystal structure is stacked by applying the dispersion onto the excitation source. In this case, a wavelength of the pump photon of the excitation source may overlap a photonic bandedge region of the photonic crystal structure. The photonic crystal structure may be stacked through self-assembly. A method such as sedimentation or vertical dip coating may be used to stack the photonic crystal structure. The former method is a method that may rapidly form a crystal using the gravitational force and the van der Waals force. In the case of the latter method, a crystal having little defects may be obtained using a phenomenon where the dispersion moves up along a surface of a substrate by means of a capillary force when the substrate is vertically dipped into the dispersion.

FIG. 9 shows diagrams schematically illustrating methods of stacking a photonic crystal structure using self-assembly and scanning electron microscope (SEM) photographs of the photonic crystal structure formed using each of the methods. Referring to (a) and (b) of FIG. 9, it was observed that the photonic crystal structure, in which the silica nanosphere dispersion containing Ir-based phosphors is orderly arranged on the substrate using (a) sedimentation and (b) vertical dip coating method, may be obtained.

According to the above-mentioned preparation method, by using the nanospheres containing phosphors, an additional photonic crystal effect may be given to a fluorescent material which merely acts to emit light. Therefore, the light emitting device using the nanospheres has a characteristic in significantly improving luminous efficiency using the photonic bandedge effect. The light emitting device may be, for example, applied to the white LED.

Hereinafter, configurations and effects of the present disclosure will be described in detail with respect to specific examples and comparative examples; however, these examples are merely illustrative to make the present disclosure better understood and do not limit the scope of the present disclosure.

Preparation Example 1

Preparation of Ir-Based Phosphors

Starting from IrCl$_3$nH$_2$O and 2-phenylpyridine (ppy) purchased from Aldrich, an Ir (III)-dichloro-bridged dimer, [Ir(ppy)$_2$Cl]$_2$, was synthesized according to the Nonoyama route. The IrCl$_3$nH$_2$O was refluxed with a 2 to 2.5 equivalent amount of a cyclometalated ligand, ppy, in a 3:1 mixture of 2-ethoxyethanol and water. The [Ir(ppy)$_2$Cl]$_2$ dimer was dissolved in tetrahydrofuran, and mixed with excess (3-aminopropyl) triethoxysilane (APTES) to prepare a solution in which the dimer is mixed with APTES in a molar ratio of 1:2.5. The solution was stirred at room temperature for 12 hours in a nitrogen atmosphere to obtain Ir(ppy)$_2$-APTES phosphors.

Preparation Examples 2 to 6

Preparation of Silica Nanospheres to which Phosphors are Inserted

Ammonium hydroxide (NH$_4$OH, 28%, Carlo Erba) was mixed at a content of 10 ml, 10.3 ml, 10.5 ml, 11 ml or 15 ml (Preparation Examples 2, 3, 4, 5 and 6, respectively) with 50 ml of methanol (CH$_3$OH, 99.9%, Carlo Erba), and 1 ml of tetraethylorthosilicate (TEOS, 99.999%, Sigma-Aldrich) and 1 ml of APTES were added to the resulting mixture. After 4 minutes of the addition of the TEOS, 0.5 ml of the Ir(ppy)$_2$-APTES phosphors prepared in Preparation Example 1 were added, and stirred at a temperature of 30° C. for 15 minutes to synthesize silica nanospheres to which the phosphors are inserted.

Preparation Example 7

Preparation of Silica Nanospheres for Inverse Opal Structure 50 ml of CH$_3$OH (99.9%, Carlo Erba), 150 ml of n-propanol (CH$_3$CH$_2$CH$_2$OH, 99.9%, Carlo Erba) and 20 ml of ammonium hydroxide (NH$_4$OH, 28%, Carlo Erba) were mixed, and 1 ml of TEOS (99.999%, Sigma-Aldrich) was added to synthesize silica nanospheres having a mean diameter of 210 nm.

FIG. 10 is a SEM photograph illustrating changes in size of the silica nanospheres prepared in Preparation Examples 2, 3 and 5. Referring to FIG. 10, it was revealed that the diameter of the silica nanospheres increases to approximately 160 nm, 180 nm and 220 nm as the amount of the ammonium hydroxide increases to 10 ml, 10.3 ml and 11 ml, respectively.

Example 1

Figure 11:
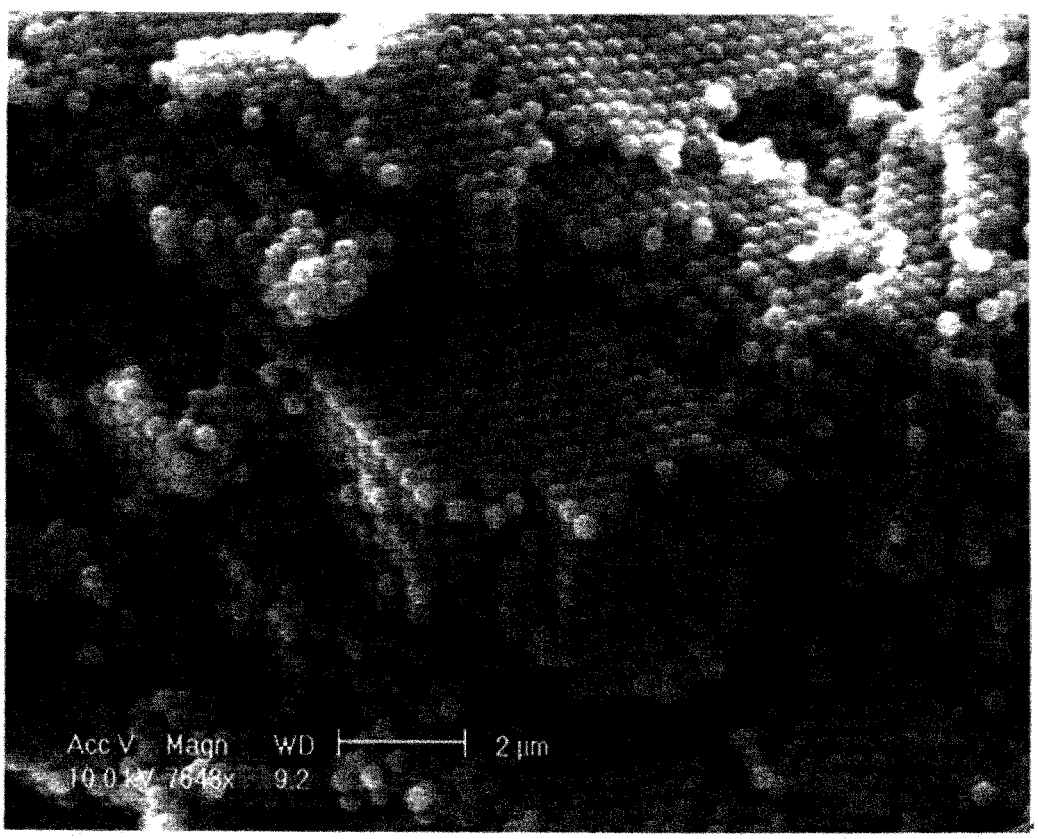
FIG. 11 is a diagram illustrating a SEM photograph of a photonic crystal structure composed of silica nanospheres containing phosphors prepared in Example 1.

Preparation of Photonic Crystal Structure Composed of Phosphor-Containing Silica Nanospheres Starting from the silica nanospheres containing the Ir(ppy)$_2$Cl-APTES phosphors of Preparation Example 4, a photonic crystal structure as shown in FIG. 11 was formed on a glass substrate using a dip coating method.

Example 2

Figure 12:
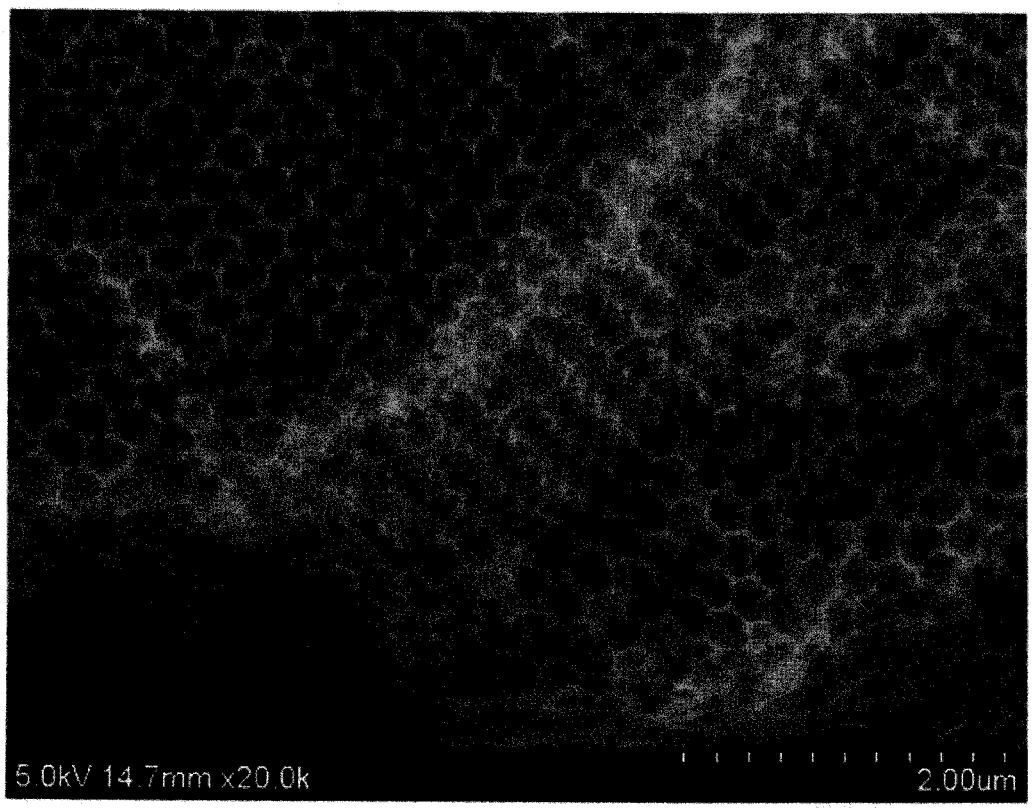
FIG. 12 is a diagram illustrating a SEM photograph of a poly(methylmethacrylate) inverse opal photonic crystal structure into which quantum dots prepared in Example 2 are inserted.

Preparation of Poly(Methylmethacrylate) Inverse Opal Photonic Crystal Structure to which Quantum Dots are Inserted The silica nanospheres of Preparation Example 7 were self-assembled using a vertical self-assembly method to form a thin film of an fcc structure. The self-assembled thin film was used as a template for inverse opal structure. The template was filled with methylmethacrylate (MMA) monomer containing CdSe/ZnS core/shell-type quantum dots. The MMA monomer was hardened to poly(methylmethacrylate) (PMMA). Then, the silica nanospheres were dissolved with hydrofluoric acid to form a polymer thin film having an inverse opal structure as shown in FIG. 12.

Prediction Example

Figure 13:
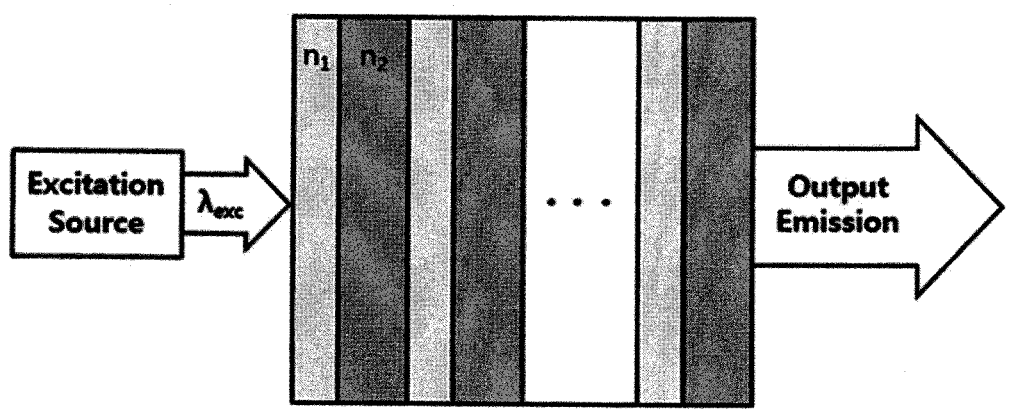
FIG. 13 is a schematic view of a setup for measuring emission intensity by introducing a pump photon into a 1D DBR structure containing phosphors.

Simulation of Emission Intensity of Light Emitting Device Containing Photonic Crystal Structure The phosphor-containing 1D DBR structure preferably prepared as shown in FIG. 13 was assumed to predict an emission intensity of the light emitting device having a photonic crystal structure. This has a PBG since it has a structure where materials having indices of refraction of n1 and n2 are alternately stacked in multiple layers. When the pump photon excites the phosphors, the emission intensity of the phosphors may be expected to be determined by integrating an extent where the pump photon ($\lambda_{exc}$) corresponding to a photonic bandedge mode is distributed inside the 1D DBR structure.

Figure 14:
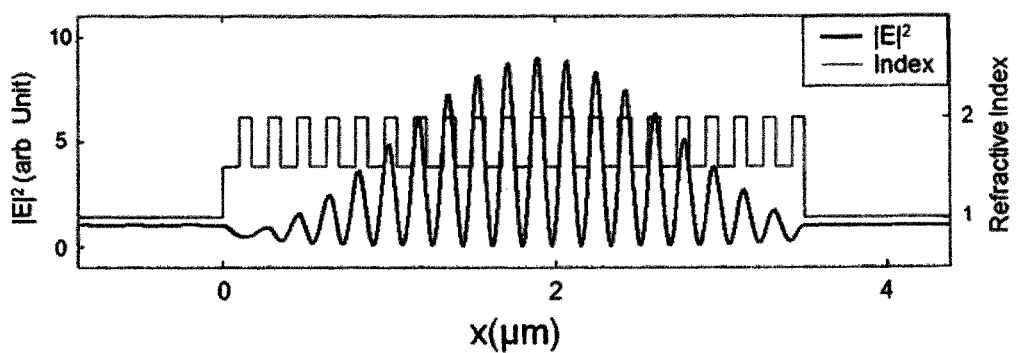
FIG. 14 is a graph illustrating the pump photon being distributed inside the 1D DBR structure when the pump photon around a photonic bandedge region is vertically incident to the 1D DBR structure.

FIG. 14 is a graph illustrating the pump photon being distributed inside the 1D DBR structure when the pump photon around the photonic bandedge region is vertically incident to the 1D DBR structure. Referring to FIG. 14, the pump photon moves in an X axis direction, and the Y axis represents intensity of the pump photon moving through the 1D DBR structure.

Figure 15:
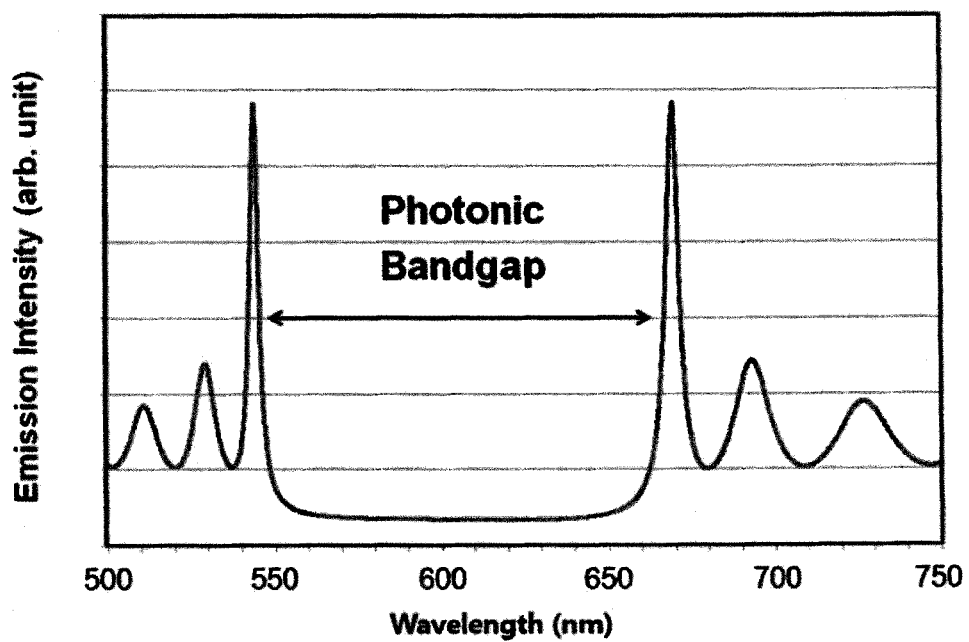
FIG. 15 is a graph obtained by integrating intensity of the pump photon inside the 1D photonic crystal structure depending on a wavelength of the pump photon.

FIG. 15 is a graph plotted by integrating the intensity of the pump photon in the 1D photonic crystal structure depending on a wavelength of the pump photon. Referring to FIG. 15, peaks appear in both boundaries of the PBG due to a photonic bandedge effect. It is shown that a wavelength region of the pump photon exists at which emission intensity is significantly increased due to the photonic bandedge effect.

Figure 16:
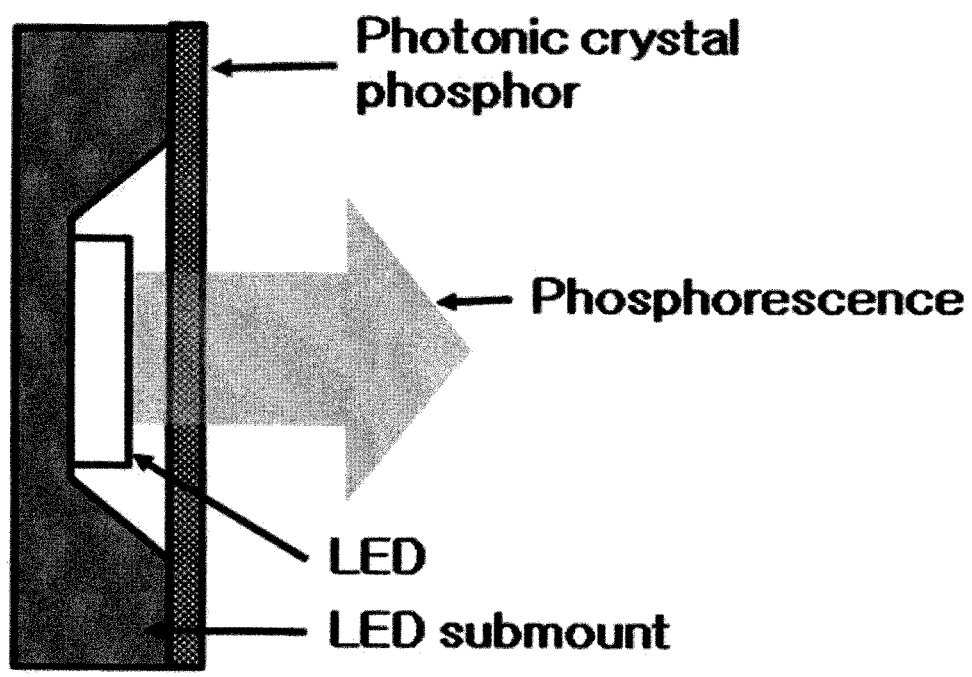
FIG. 16 is a schematic view illustrating the photonic crystal structure being mounted onto a real LED.

FIG. 16 is a schematic view illustrating the photonic crystal structure mounted onto a real LED. Referring to FIG. 16, it is shown that the phosphors are excited by light emitted from the LED, and phosphorescence is then passed through the photonic crystal structure and emitted.

The foregoing is illustrative of the present disclosure and is not to be construed as limiting thereof. Although numerous embodiments of the present disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of the present disclosure and is not to be construed as limited to the specific embodiments disclosed, and that modifications to the disclosed embodiments, as well as other embodiments, are intended to be included within the scope of the appended claims. The present disclosure is defined by the following claims, with equivalents of the claims to be included therein.

What is claimed is:
1. A light emitting device comprising:
an excitation source which emits a first light having a first wavelength; and
a photonic structure arranged on the excitation source and having phosphors excited by the first light emitted from the excitation source to emit a second light, wherein the photonic structure is a multilayer structure having one dimensional photonic crystal layers, wherein at least one photonic crystal layer of said one dimensional photonic crystal layers contains said phosphors therein,
wherein the photonic structure having a photonic bandgap and two bandedges on both ends of the bandgap, wherein the first wavelength coincides with one of the bandedges such that the first light having the first wavelength penetrates into the photonic structure and forms an electromagnetic standing wave as a result of a photonic bandedge effect inside the photonic structure to excite the phosphors to emit the second light, wherein an electric field intensity of the first light inside the photonic structure is greater than an electric field intensity of the first light outside the photonic structure.

2. The light emitting device according to claim 1, wherein the excitation source excites the phosphors to emit the second light which is shifted to a second wavelength longer than the first wavelength of the first light emitted from the excitation source.

3. The light emitting device according to claim 1, wherein the excitation source is a light emitting diode or a laser diode.

4. The light emitting device according to claim 1, wherein a pump photon of the excitation source is redistributed inside the photonic structure by the first light entered into the photonic structure.

5. The light emitting device according to claim 1, wherein the photonic structure has a periodic refractive index profile.

6. The light emitting device according to claim 5, wherein the bandedge corresponds to the first wavelength of the light emitted from the excitation source.

7. The light emitting device according to claim 1, wherein thicknesses and/or refractive indices of individual layers of the photonic structure are controlled so that the first wavelength of a pump photon emitted from the excitation source overlaps the photonic bandedge of the photonic structure.

8. The light emitting device of claim 1, wherein the photonic structure is in direct contact with the excitation source.

9. The light emitting device of claim 1, wherein the first light entered into the photonic crystal structure forms a mode of standing waves inside the photonic crystal structure.

10. The light emitting device of claim 1, wherein said at least one photonic crystal layer includes nanospheres each containing said phosphors therein.

11. The light emitting device of claim 1, wherein said phosphors include quantum dots.

\* \* \* \* \*